United States Patent
Carlson

(10) Patent No.: US 8,350,732 B2
(45) Date of Patent: Jan. 8, 2013

(54) COMPRESSION WITH ADJUSTABLE QUALITY/BANDWIDTH CAPABILITY

(75) Inventor: David A. Carlson, Haslet, TX (US)

(73) Assignee: Cavium, Inc., San Jose, CA (US)

( * ) Notice: Subject to any disclaimer, the term of this patent is extended or adjusted under 35 U.S.C. 154(b) by 121 days.

(21) Appl. No.: 13/105,401

(22) Filed: May 11, 2011

(65) Prior Publication Data

US 2012/0286979 A1 Nov. 15, 2012

(51) Int. Cl.
*H03M 7/30* (2006.01)

(52) U.S. Cl. ............................................. 341/51; 341/87

(58) Field of Classification Search ...................... 341/51, 341/65, 67, 87, 106
See application file for complete search history.

(56) References Cited

U.S. PATENT DOCUMENTS

| | | | | | |
|---|---|---|---|---|---|
| 4,558,302 | A | * | 12/1985 | Welch | 341/51 |
| 4,906,991 | A | * | 3/1990 | Fiala et al. | 341/51 |
| 5,142,282 | A | * | 8/1992 | Tobin et al. | 341/55 |
| 5,281,967 | A | * | 1/1994 | Jung | 341/55 |
| 5,463,390 | A | * | 10/1995 | Whiting et al. | 341/51 |
| 5,506,580 | A | * | 4/1996 | Whiting et al. | 341/51 |
| 5,532,694 | A | * | 7/1996 | Mayers et al. | 341/67 |
| 7,260,217 | B1 | | 8/2007 | Carlson | |
| 7,403,136 | B2 | * | 7/2008 | De La Cruz et al. | 341/51 |
| 7,538,695 | B2 | | 5/2009 | Laker et al. | |
| 7,650,040 | B2 | | 1/2010 | Ghildiyal | |
| 7,764,205 | B2 | | 7/2010 | Owsley et al. | |
| 2012/0262314 | A1 | | 10/2012 | Carlson | |

OTHER PUBLICATIONS

Huffman, David A., "A Method for the Construction of Minimum-Redundancy Codes," *Proceedings of the I.R.E.*, pp. 1098-1101, Sep. 1952.

Ziv, Jacob, et al., "A Universal Algorithm for Sequential Data Compression," IEEE Trans. Inform. Theory, vol. IT-23, No. 3, pp. 337-343, 1977.

"Data Compression Method-Adaptive Coding with Sliding Window for Information Interchange," American National Standards Institute, ANSI X3.241, pp. 1-8, Aug. 1994.

L. Peter Deutsch, Deflate Compressed Data Format Specification version 1.3, Internet RFC 1951, pp. 1-15, May 1996.

"The BIG-IIP System With Intelligent Compression: Cutting Application Delivery Time and Optimizing Bandwith", F5 Networks, Inc., pp. 1-7, Aug. 2005.

\* cited by examiner

*Primary Examiner* — Howard Williams
(74) *Attorney, Agent, or Firm* — Hamilton, Brook, Smith & Reynolds, P.C.

(57) ABSTRACT

The disclosure provides a system and method to vary bandwidth/speed of a compression engine to tradeoff with compression quality. The system comprises an input port receiving a data stream having a current byte and a stream of preceding and subsequent bytes thereof; a history memory storing the stream of preceding bytes in blocks of history data an index engine having a table of keys associated to memory addresses of the blocks, the index engine accessing the table to output a plurality of potential string matches upon entry of the current byte; a search engine processing the potential string matches by fetching the blocks of history data associated with each of the plurality of potential string matches and comparing a portion of each of the blocks to the current byte to output a string upon matching consecutive bytes in the block to the current byte and subsequent bytes thereof; and a control input limiting the number of potential string matches processed by the search engine.

34 Claims, 13 Drawing Sheets

WATERFALL DIAGRAM 800

802 — Speed=2

| | CYCLE 1 (802a) | CYCLE 2 (802b) | CYCLE 3 (802c) |
|---|---|---|---|
| 804 — Pipe Stage 1 (Search Eng.) | ADDR sent to mem. Pos0 Pair0 | ADDR sent to mem. Pos1 Pair0 | ADDR sent to mem. Pos2 Pair0 |
| 806 — Pipe Stage 2 (mem. que.) | | ADDR sent to mem. Pos0 Pair0 | ADDR sent to mem. Pos1 Pair0 |
| 808 — Pipe Stage 3 (mem.) | | | Data send from mem. Pos0 Pair0 |
| 810 — Pipe Stage 4 (search eng.) | | | |
| Odd: matchlen$_x$ — 812a | | | |
| Odd: longmatch$_{x1}$ — 814a | | | |
| Odd: len$_x$ — 816a | | | |
| Even: matchlen$_x$ — 812b | | | |
| Even: longmatch$_x$ — 814b | | | |
| Even: len$_x$ — 816b | | | |
| FIFO: Long FIFO 1 — 818 | | | |
| FIFO: Long FIFO 2 — 820 | | | |
| FIFO: Long FIFO 3 — 822 | | | |
| 824 — MaxLen | 1 | 1 | 1 |
| 826 — anchorpos | -3 | -2 | -1 |
| 828 — longcount | 0 | 0 | 0 |
| 830 — bestdist | | | |
| 832 — Pipe State 5 (Search eng.) | | | |

| 802d | 802e | 802f | 802g | 802h |
|---|---|---|---|---|
| CYCLE 4 | CYCLE 5 | CYCLE 6 | CYCLE 7 | CYCLE 8 |
| ADDR sent to mem. Pos3 Pair0 | ADDR sent to mem. Pos0 Pair0 | ADDR sent to mem. Pos1 Pair0 | ADDR sent to mem. Pos2 Pair0 | ADDR sent to mem. Pos10 Pair0 |
| ADDR sent to mem. Pos2 Pair0 | ADDR sent to mem. Pos3 Pair0 | ADDR sent to mem. Pos0 Pair0 | ADDR sent to mem. Pos1 Pair0 | ADDR sent to mem. Pos2 Pair0 |
| Data send from mem. Pos1 Pair0 | Data send from mem. Pos2 Pair0 | Data send from mem. Pos3 Pair0 | Data send from mem. Pos0 Pair0 | Data send from mem. Pos1 Pair0 |
| Data compared Pos0 Pair0 | Data compared Pos1 Pair0 | Data compared Pos2 Pair0 | Data compared Pos3 Pair0 | Data compared Pos0 Pair0 |
| 6 0 6 | 6 1 6 | 14 1 14 | 13 1 13 | |
| 5 1 5 | 7 1 7 | 10 0 10 | 2 0 2 | 20 1 25 |
| Pos0Pair0 | Pos1Pair0 | Pos2Pair0 | | Pos0Pair0 |
| 6 0 1 | 7 0 2 | 10 0 3 | 10 0 3 | 25 0 3 |
| Pos0 Pair0 (E) | Pos1 Pair0 (E) | Pos2 Pair0 (O) | Pos0 Pair0 (E) | Pos0 Pair0 (E) |
| | | | | |

| | 802i | 802j | 802k | 802l | 802m |
|---|---|---|---|---|---|
| | CYCLE9 | CYCLE10 | CYCLE11 | CYCLE12 | CYCLE13 |
| | ADDR sent to mem. Pos0 Pair0 | ADDR sent to mem. Pos25 Pair0 | ADDR sent to mem. Pos26 Pair0 | ADDR sent to mem. Pos26 Pair1 | ADDR sent to mem. Pos33 Pair0 |
| | ADDR sent to mem. Pos10 Pair0 | ADDR sent to mem. Pos0 Pair0 | ADDR sent to mem. Pos25 Pair0 | ADDR sent to mem. Pos26 Pair0 | ADDR sent to mem. Pos26 Pair1 |
| | Data send from mem. Pos2 Pair0 | Data send from mem. Pos10 Pair0 | Data send from mem. Pos0 Pair0 | Data send from mem. Pos25 Pair0 | Data send from mem. Pos26 Pair0 |
| | Data compared Pos1 Pair0 | Data compared Pos2 Pair0 | Data compared Pos10 Pair0 | Data compared Pos0 Pair0 | Data compared Pos25 Pair0 |
| | 11 | 11 | 3 | | |
| | 0 | 0 | 0 | | |
| | 17 | 11 | 3 | | |
| | 5 | | 4 | 8 | |
| | 0 | | 0 | 0 | 0 |
| | 12 | | 4 | 33 | |
| | | | | | |
| | | | | | |
| | | | | | |
| | 25 | 25 | 25 | 33 | 33 |
| | 0 | 0 | 0 | 0 | 0 |
| | 2 | 1 | 1 | 0 | 0 |
| | Pos0 Pair0 (E) | Pos0 Pair0 (E) | Pos0 Pair0 (E) | Pos0 Pair0 (E) | Pos0 Pair0 (E) |
| | | | | Output string (#0,0,E;33) | |

FIG. 8C

COMPRESSION WITH ADJUSTABLE QUALITY/BANDWIDTH CAPABILITY

BACKGROUND

The heart of data compression is finding repeated data patterns in a data stream. Compression quality is generally affected by the thoroughness in processing potential matches of repeating data patterns. The more thorough the data stream is searched, the more likely a longer repeated data pattern is found. Conversely, the more thorough the searched, the longer the search will likely take to perform, thereby reducing the bandwidth of the compression engine performing the searching. Compressibility of data varies depending on the application and the type of data. Compression engines generally speculate potential matches to repeatable patterns by indexing the data stream. To achieve a certain compression quality, the compression engine is generally configured with a predetermined searched parameter associated to the processing of potential matches. However, it is desirable for the compression engine to improve bandwidth (e.g. throughput speed) at the expense of compression quality.

SUMMARY

The disclosure provides, among other things, a system and a method to vary the bandwidth (e.g. throughput speed) of a compression engine at the expense of compression quality (e.g., thoroughness of search). According to the present disclosure, in one scenario, the throughput of the compression engine was nearly doubled for certain datasets when merely a third of the searching was limited, for example, by limiting searching of some of the potential matches.

The present disclosure is also related to providing better performance for poor compressibility datasets by optimizing the operation of the search engine for such conditions. One means of doing so is to perform the search in pipeline operations. Speculation of poor compressible data sets may be employed. In such embodiments, the pipeline operation is configured with the assumption that no match will be found. As a result, the pipeline operation may initiate the searching process for potential matches beyond the current search position prior to the results of the current search position being known.

The pipeline operation is configured to process all of the potential matches for a current searching portion of the data stream prior to evaluating the full extent of the match. Structural configuration of the peripheral components, e.g. parallel memory and redundant memory operations, provides further throughput improvements.

The present disclosure relates to a system comprising: an input port receiving a data stream having a current byte and a stream of preceding and subsequent bytes thereof; a history memory storing the stream of preceding bytes in blocks of history data; an index engine having a table of keys associated to memory addresses of the blocks, the index engine accessing the table to output a plurality of potential string matches upon entry of the current byte; a search engine processing the potential string matches by fetching the blocks of history data associated with each of the plurality of potential string matches and comparing a portion of each of the blocks to the current byte to output a string upon matching consecutive bytes in the block to the current byte and subsequent bytes thereof; and a control input limiting the number of potential string matches processed by the search engine.

The present disclosure further relates to a method comprising: receiving a data stream having a current byte and a stream of preceding and subsequent bytes thereof; storing the stream of preceding bytes in blocks of history data; processing a table to output a plurality of potential string matches upon entry of the current byte, the table having keys associated to addresses of stored history data; processing the potential string matches by fetching the blocks of history data associated with each of the plurality of potential string matches and comparing a portion of each of the blocks to the current byte to output a string upon matching consecutive bytes in the block to the current byte and subsequent bytes thereof; and limiting the number of potential string matches processed based on a control input.

In the illustrative embodiment, the search engine limits the fetching of the history data for potential string matches based on the control input. In an alternate embodiment, the search engine limits the comparison of the fetched history data of the potential string matches based on the control input.

According to another aspect of the disclosure, the search engine stores a match of the fetched history data that extends beyond the block, such as within a queued buffer, a memory, or a FIFO. The search engine may process all the potential matches once prior to processing the full extent of the matching.

According to yet another aspect of the disclosure, the history data are fetched with redundant data from another block of history data. The redundant data may be of a subsequent history data block. In some embodiments, the redundant data is stored within the memory to allow for simpler accessing. The memory may be banked to allow for simultaneous processing of multiple potential matches, as pairs. The search engine may fetch a second block of memory data when fetching the first block of memory data. The search engine may compare the second block of memory data to the searched portion of the data stream when comparing the first block of memory data. Upon a match, the search engine outputs the longer matching repeating data pattern. The search engine may process the current searching position in the data stream and consecutive positions thereof prior to determining a found repeating pattern. The current searching position may comprise more than one byte.

According to yet another aspect of the disclosure, the system may further comprise an encoder to encode the description of the repeating data pattern or description of non-repeating data pattern with a symbol. The encoding may be correlated the frequency of repetition of the descriptions. The symbols may include Huffman based symbols.

The disclosure also provides a apparatus comprising means for receiving a data stream having a current byte and a stream of preceding and subsequent bytes thereof; means for storing the stream of preceding bytes in blocks of history data; means for accessing a table to output a plurality of potential string matches upon entry of the current byte, the table having keys associated to addresses of stored history data; means for processing the potential string matches by fetching the blocks of history data associated with each of the plurality of potential string matches and comparing a portion of each of the blocks to the current byte to output a string upon matching consecutive bytes in the block to the current byte and subsequent bytes thereof; and means for limiting the number of potential string matches based on a control input.

The disclosure also provides a computer program product comprising a computer readable storage medium having a computer readable program, wherein the computer readable program when executed on a computer causes: receiving a data stream having a current byte and a stream of preceding and subsequent bytes thereof; storing the stream of preceding bytes in blocks of history data; processing a table to output a plurality of potential string matches upon entry of the current byte, the table having keys associated to addresses of stored history data; processing the potential string matches by fetching the blocks of history data associated with each of the plurality of potential string matches and comparing a portion of each of the blocks to the current byte to output a string upon matching consecutive bytes in the block to the current byte and subsequent bytes thereof; and limiting the number of potential string matches processed based on a control input.

The disclosure also provides for a method comprising: receiving a data stream having a current byte and a stream of preceding and subsequent bytes thereof; storing the stream of preceding bytes in blocks of history data; processing a table to output a plurality of potential string matches upon entry of a portion of the data stream, the table having keys associated to addresses of stored history data; processing the potential string matches by fetching the blocks of history data associated with each of the plurality of potential string matches and comparing a portion of each of the blocks to the current byte to output a string upon matching consecutive bytes in the block to the current byte and subsequent bytes thereof; and processing a second plurality of potential string matches as a result of speculating that the comparison does not result in output of the string. Processing of the second plurality of potential string matches as a result of speculating may comprise fetching subsequent blocks of history data before the output of the string.

The disclosure also provides a system comprising: an input port receiving a data stream having a current byte and a stream of preceding and subsequent bytes thereof; a history memory storing the stream of preceding bytes in blocks of history data; an index engine having a table of keys associated to memory addresses of the blocks, the index engine accessing the table to output a plurality of potential string matches upon entry of a portion of the data stream; and a search engine processing the potential string matches by fetching the blocks of history data associated with each of the plurality of potential string matches and comparing a portion of each of the blocks to the current byte to output a string upon matching consecutive bytes in the block to the current byte and subsequent bytes thereof, the search engine processing a second plurality of potential string matches as a result of speculating that the comparison does not result in output of the string.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 8 is a waterfall diagram of the operation of the search engine at improved bandwidth speed in accordance with the illustrative embodiment;

DETAILED DESCRIPTION

A. System

Figure 1:
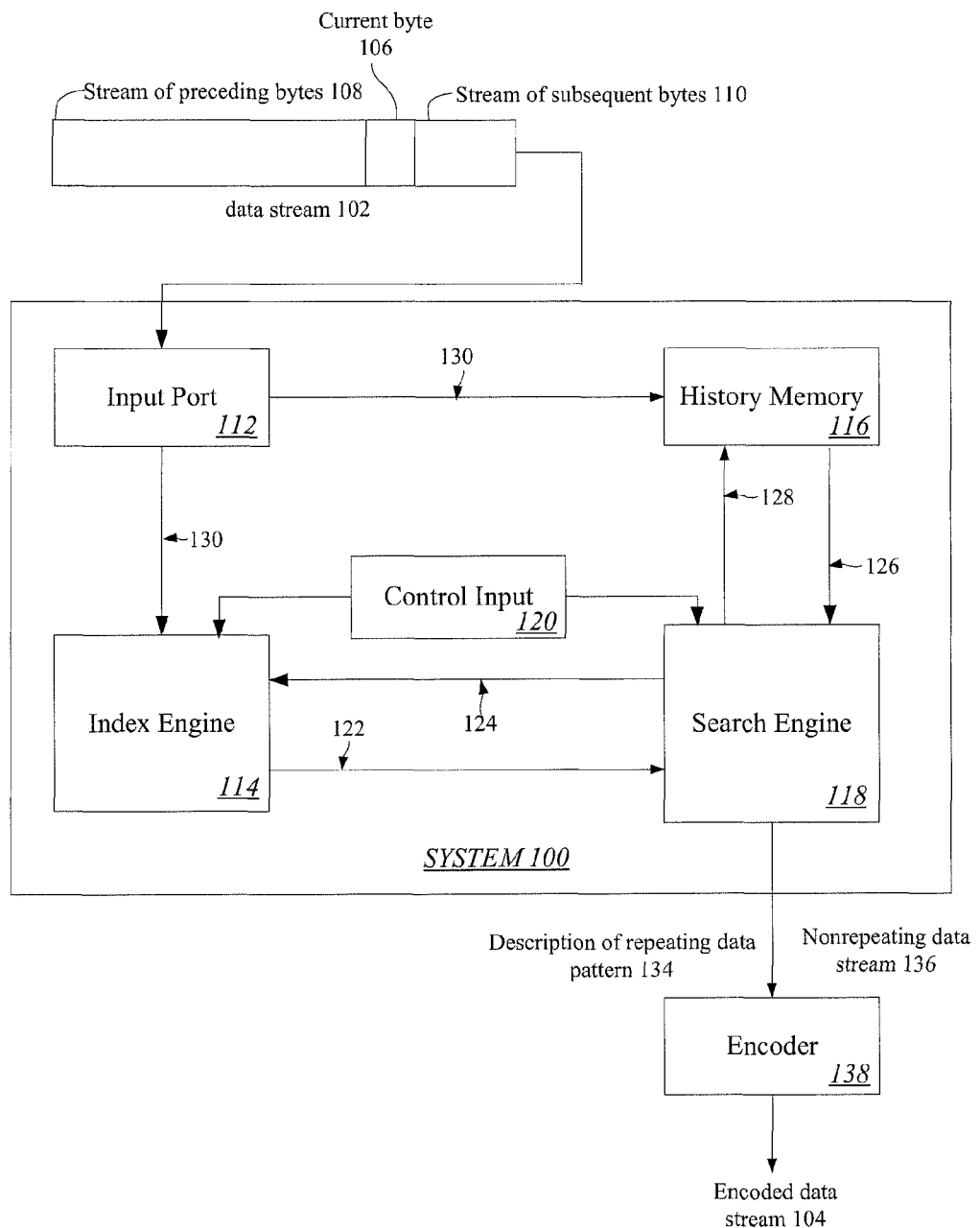
FIG. 1 is a diagram of a system in accordance with the illustrative embodiment.

FIG. 1 is a diagram of the system 100 in accordance with the illustrative embodiment.

Figure 3:
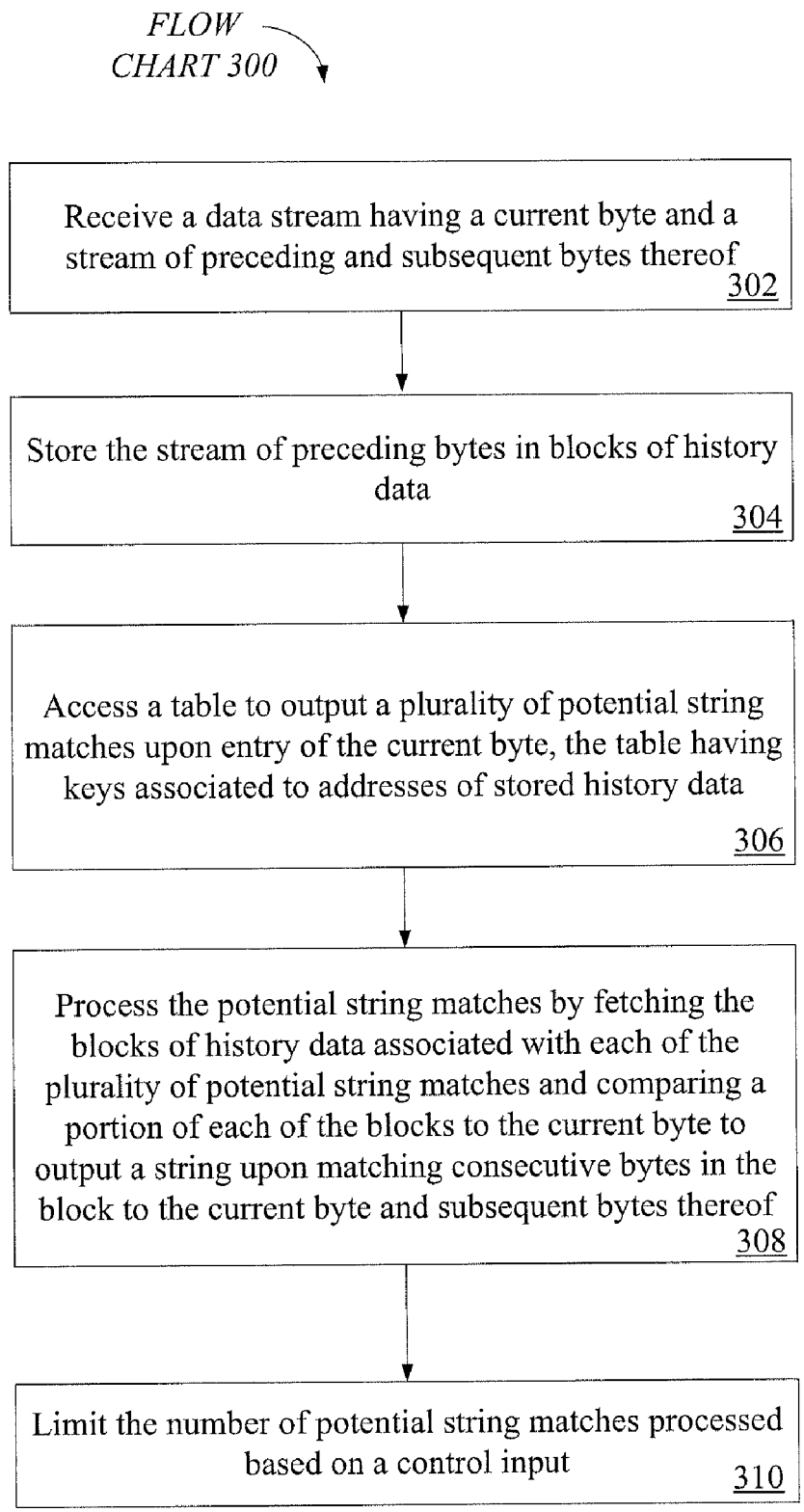
FIG. 3 is a flowchart of a method of operation of the search engine in accordance with the illustrative embodiment.

The system 100 receives a data stream 102 and outputs an encoded data stream 104. The data stream 102 comprises a current byte 106, a stream of preceding bytes 108, and a stream of subsequent bytes 110. The system comprises an input port 112, an index engine 114, a history memory 116, a search engine 118, and a control input 120. Referring to FIG. 3, a method 300 of operation in accordance with the illustrative embodiment is discussed. The input port 112 receives the data stream 102 having a current byte 106 and a stream of preceding and subsequent bytes 108, 110 (block 302). The history memory 116 stores the stream of preceding bytes 108 in blocks of history data (block 304). The index engine 114 has a table of keys associated to memory addresses of the blocks (block 306); the index engine 114 accessing the table to output a plurality of potential string matches 122 upon entry of a searched portion 124 (block 306). The search engine 118 processes the potential string 122 by fetching blocks of history data 126 associated with each of the plurality of potential string matches 128 and comparing a portion of each of the blocks to the current byte 106 to output a string 130 upon matching consecutive bytes in the block to the current byte 106 and subsequent bytes thereof 110 (block 308). The control input 120 limits the number of potential string matches processed by the search engine 118 (block 310).

Processing refers to the fetching of blocks of history data and the comparing of the fetched blocks. The result of the processing is an output if the condition of the processing is satisfied.

A potential string match is a reference to a portion of the data stream 102 that has the potential to contain repeating pattern with the currently processed portion of the data stream. In the illustrative embodiment, the potential string match is an address to a memory location within the history memory 116.

Referring back to FIG. 1, the input port 112 buffers the input data stream 102 and provides the buffered stream to the various components. In the illustrative embodiment, the input port 112 receives the data stream 102 having the current byte 104, the stream of preceding bytes 108 and the stream of subsequent bytes 110. The input port 112 segments portions of the received data stream 102 into blocks and sends the blocks of data 130 to the index engine 114 and to the history memory 116.

The current byte 106 is the current position that is being searched by the search engine 118. The search engine 118 and the index engine 114 receive the current byte 106. In the illustrative embodiment, the input port 112 provides the current byte 106 to the index engine 114 and the search engine 118.

The history memory 116 maintains a history of the data stream 102. In the illustrative embodiment, the history memory 116 receives the data stream 102 as block data 130 from the input port 112 and stores the received blocks within. The history memory 116 is a memory module that maintains a revolving memory scheme wherein the history memory stores the block data 130 in a contiguous manner and jumps to the starting memory address upon reaching the end of the memory module. It should be appreciated that various memory schemes may be employed, including buffering the memory using a memory pair wherein the block data 130 is stored with the alternating memory. The history memory 116 may further comprises multiple memory pairs. In the illustrative embodiment, the history memory 116 is banked to improve the throughput of the search engine by enabling parallel accessing of the history memory 116. As a result, a pair of memory addresses is concurrently accessed. In the embodiment, each bank of the history memory 116 comprises 20 KB of storage consisting of 1024 rows of 20 bytes of data. Alternatively, greater numbers of banking may be employed (e.g. 4, 8, 16) to provide for greater parallel fetching and comparing. Banking is generally conducted in powers of twos due to the convenience in determining memory access locations.

The index engine 114 provides potential matches of repetitive pattern in the data stream 102 to the search engine 118. In the illustrative embodiment, the index engine 114 maintains table comprising a plurality of index entries. The index entries further comprises a plurality of keys associated to memory addresses of indexed portions of the history memory 116. The indexed key bits allow for the elimination of false matches in the table. In the illustrative embodiment, the index engine 114 uses the memory address of the block of data received by the history memory 116 to associate to the indexing bits and the index key bits. The index engine 114 accesses the table to output a plurality of potential string matches 122 upon entry of the searched portion 124.

The searched portion 124 is generally the current byte 106; however, the search portion 124 may include multiple bytes that begin with the current byte 106.

In the illustrative embodiment, the index engine 114 comprises a cyclic redundancy check (CRC) module and a hash table. The CRC module generates the index and keys (as a CRC bit stream) from the received blocks of data 130 that populates the hash table. In the illustrative embodiment, the CRC module generates a 20-bit CRC bit stream from the received fixed length bit stream 130 having 24-bit (3-bytes). Of the 20 CRC-generated bits, 12 bits are allocated as the indexing bits for a 4096-entry table and 6 bits are allocated as the index keying bits. It should be appreciated that more CRC generated bits may be utilized for greater fidelity, however, the result being a larger hash table which consumes more resources.

Generally, the history memory 116 and the index engine 114 are synchronized to maintain association between indexing of the data stream 102 and the memory addresses associated to the indexing bits and keying bits in the table. Association relates to being accessible through the association, such as through the use of a pointer referencing a memory location or address recognized by the system. In the illustrative embodiment, the history memory 116 maintains a counter of the current address therein and the index engine 114 maintains synchronization to the counter of the history memory 116. It should be appreciated that maintaining synchronization between the history memory 116 and index engine 114 is known in the art, such as, for example, using a synchronization signal from the history memory 116 to the index engine 114. In alternate embodiments, the counter is maintained independently, such as using a shared global clock or trigger signal from other circuitries, such as the search engine 118 or a shared state controller. In another alternate embodiment, the index engine 114 maintains the counter, which is provided to the history memory 116 to maintain synchronization.

The memory address of the history memory 116 is generally a physical address to a portion to the desired address in the history memory 116. Alternatively, the memory address may be positions expressed in byte location, or sections thereof, in the data stream 102 that is stored in the history memory 116, which is then referenced to the physical address of the history memory 116.

In alternate embodiments, the indexing bits and keying bits may be provided to the index engine 114. The association with the memory address may further be provided and in such embodiment, the index engine 114 populates the table with the index bits, the keying bits, and the associated memory address. In another alternate embodiment, the index bits and keying bits may be provided and the index engine 114 determines the association based on the synchronization with the history memory 116.

In another aspect of the illustrative embodiment, the index engine 114 continually updates the indexed data stream 102. The index engine 114 maintains a counter of the allocated portions of the tables, including the indexed row and the keyed buckets within each of the indexed rows. When the table is configured to be finite, as new indexed portions of the data stream are inserted into the table, older entries within the table are pushed out when the table becomes full. Alternatively, the index engine 118 may maintain priority or weight of the indexed portions of the data stream to remove the lower priority/weighted indexed portions rather than the oldest. In another alternate embodiment, the index engine 114 may read the indexed portions, modify the entry, and write over the read entry with the modified entry.

The table may be further optimized to improve throughput. Techniques, including using banked hash table, may be utilized. In the illustrative embodiment, the table comprises hash tables that are banked to provide improved throughput performance to the index engine 118. In the embodiment, the lowest 3 bits of the 20 CRC-generated bit is utilized to access 8 banked tables.

The control input 120 limits the number of potential string matches that may be searched by the search engine 118 to allow the system 100 to vary the throughput of the system 100 by trading off compression quality in having a less thoroughly searched data stream. In the illustrative embodiment, through control line 120a, the control input 120 directs the search engine 118 to ignore a portion of the potential string matches to limit the number of potential string matches. In alternate embodiments, through control line 120b, the control input 120 directs the index engine 114 to limit accessing of the table to limit the number of potential string matches.

Figure 2:
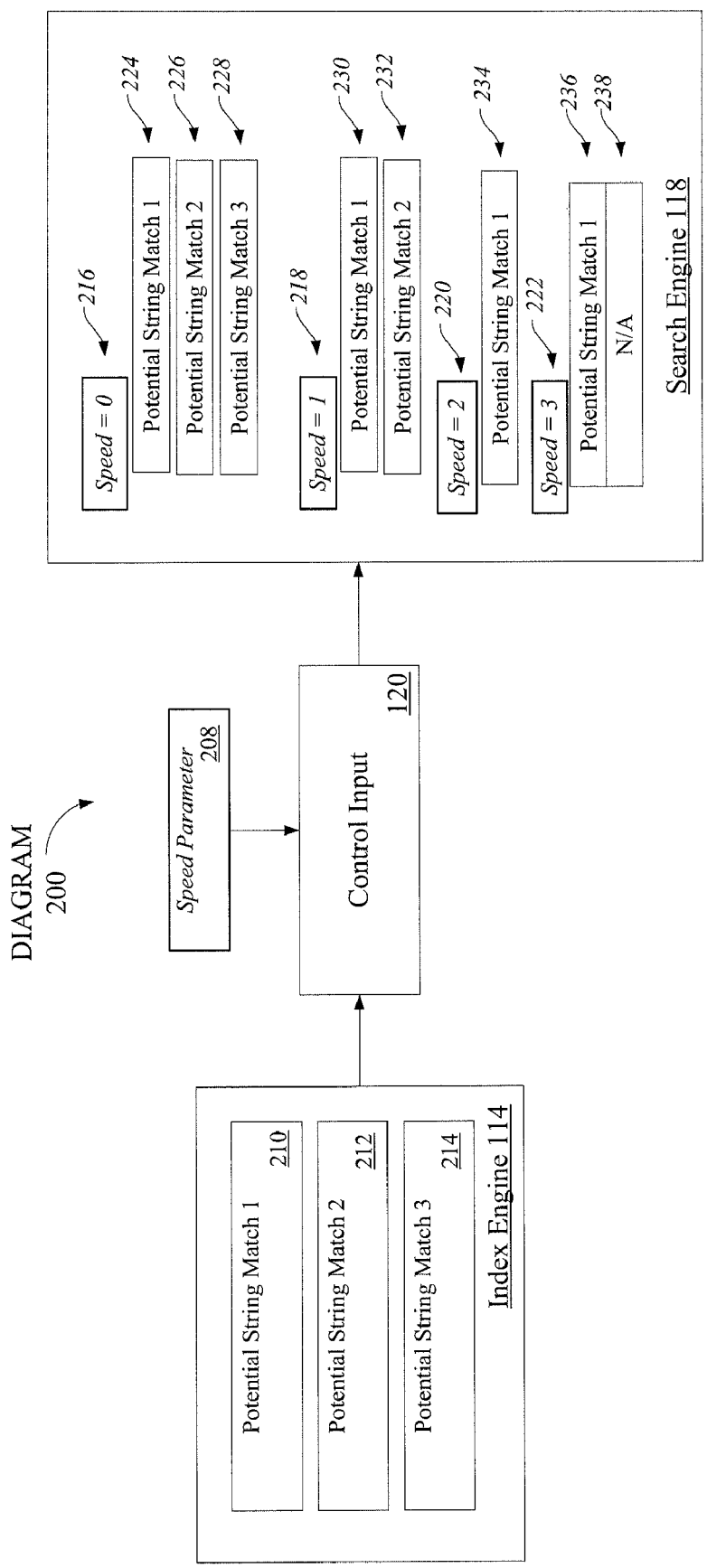
FIG. 2 is a diagram illustrating the function of the control input to vary bandwidth and compression quality in accordance with the illustrative embodiment.

FIG. 2 is a diagram 200 illustrating the function of the control input 120 to vary bandwidth and compression quality in accordance with the illustrative embodiment. In FIG. 2, the control input 120 limits the number of potential string matches 210, 212, 214 from the index engine 114 based on a speed parameter 208. In the illustrative embodiment, the control input 120 is a parameter specified by a user through a user interface. As the user varies the speed parameter, e.g., to increase the throughput of the system, the number of potential string matches processed by the system is reduced. For example, the user can specify a speed parameter of "0" (216) for the best compression quality and up to 3 potential string match pairs 224, 226, 228 being processed. As the speed parameter is varied to "1" (218) for a slight degradation in the compression quality, 2 potential string match pairs 230, 232 are processed. The user can further vary the speed parameter to "2" (220) for a better throughput speed with 1 potential string match pair 234 processed. A speed parameter of "3" (222) allows for further improved throughput speed of the system with a single potential string match 236 being processed. In such scenario, the search engine 118 processes the potential string match 236 for one position and does not process a potential string match (shown as N/A 238) in the next position. It should be appreciated that speed parameters greater than speed=3 may be employed.

In alternate embodiments, potential string matches are processed using weighting factor and are prioritized to be limited by the control input 120. In the embodiment, the potential string matches may be provided based on the recent matches found or it may be provided based on other factors, for example, such as frequency of repetition.

In the illustrative embodiment, multiple potential string matches are processed concurrently, e.g. in pairs, thus at least two string matches are provided to the search engine 118 by the index engine 114 in a single search cycle. Similarly, the search engine 118 concurrently fetches two memory addresses from the history memory 116 and two blocks of data are provided therefrom and processed by the search engine 118. In the embodiment, the speed parameter 208 is specified during system initialization and maintained as a constant parameter throughout the compression process. However, in alternate embodiments, the control input 120 may be varied during the compression cycle. A monitoring circuitry may be employed to actively assess the value of the speed parameter 208.

Referring again to FIG. 1, the search engine 118 receives the current byte 106 and receives potential string matches 122 from the index engine 114. The search engine 118 fetches a block of data 128 for each potential string match by sending the memory address 126 associated with the block of data to the history memory 116. The search engine 118 outputs a description of repeating data pattern 132, e.g. a string, upon a match longer than a predetermined minimum length. The search engine 118 outputs a non-repeating data byte 134, e.g. a literal, if no match is found. To perform the comparison, the search engine 118 shifts the fetched block of data 126 to the specific address correlated to the potential match. Alternatively, the search engine may shift the current byte being processed to the specific address of the potential match.

A string refers to a description of repeating patterns within the data stream. In the illustrative embodiment, a string comprises a distance parameter, and a distance parameter. The term "distance" and "offset" are used interchangeably and refers to the same thing.

A literal is a single byte (character) within the data stream.

Repeating data patterns are generally expressed by a string. Within compression protocols, such as DEFLATE and Lempel Ziv Stac (LZS), the descriptions of repeating patterns is a string comprising of a length and distance parameter. The DEFLATE protocol is defined by the Network Working Group's Request for Comments (RFC) 1951, which is incorporated by reference into the specification herein in its entirety. The Lempel Ziv STAC (LZS) protocol is defined in the American National Standard for Informational Systems— *Data Compression Method—Adaptive Coding with Sliding Window for Information Interchange* (ANSI X3.241-1994), which is incorporated by reference into the specification herein in its entirety.

Lazy Evaluation

The illustrative embodiment supports lazy evaluation defined within the DEFLATE protocol. Lazy evaluation relates to the processing of the data stream for repeating patterns at subsequent position to the current byte 106 for longer matches even after a match at the current byte 106 position is found. In the illustrative embodiment, before a string for a current position is selected, the string lengths for two subsequent byte positions after the current position are determined The search engine 118 may process subsequent bytes for lazy evaluation in a similar parallel evaluation scheme as the evaluation of the current byte 106.

Figure 6:
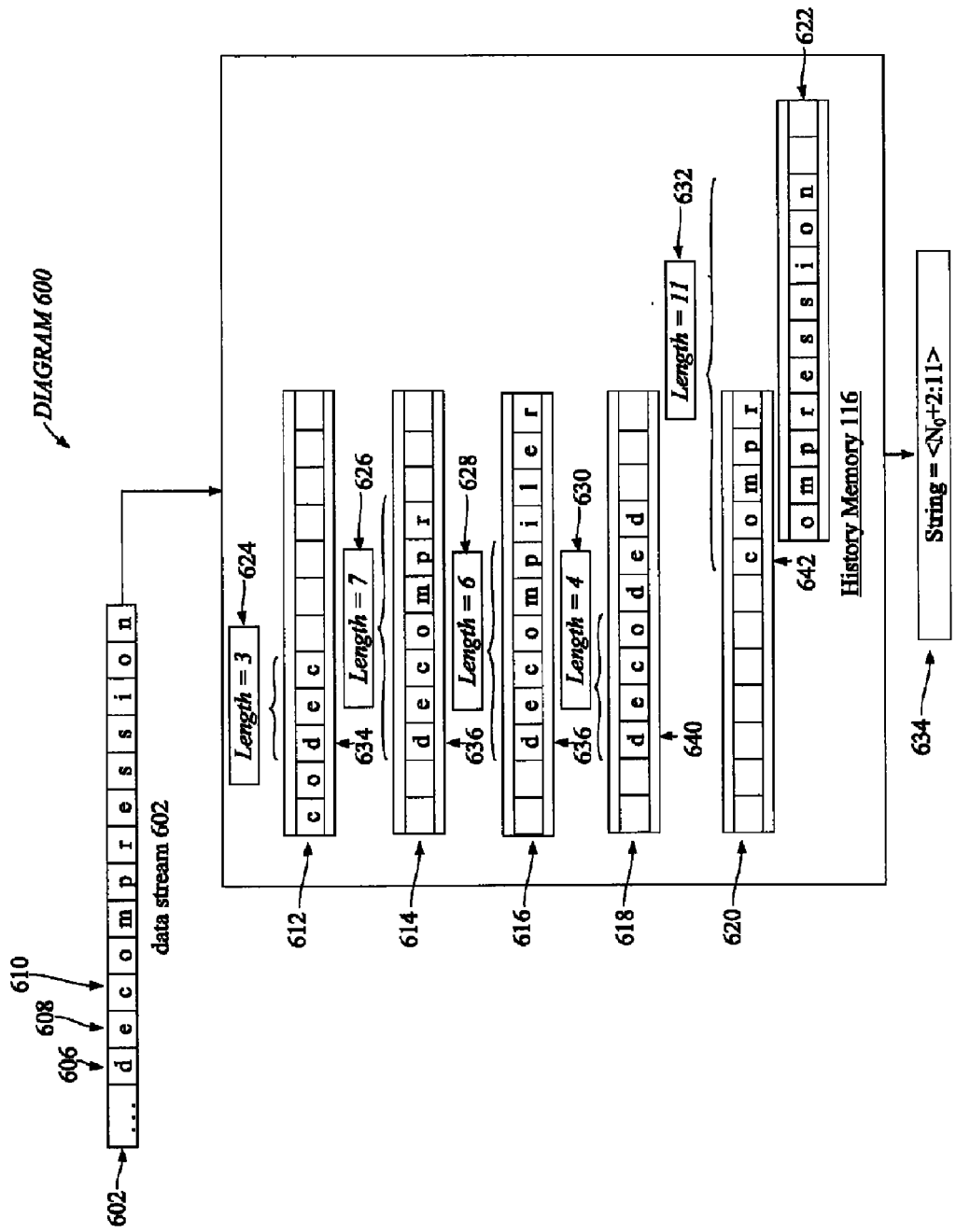
FIG. 6 is a diagram illustrating the operation of the search engine in accordance with the illustrative embodiment.

FIG. 6 illustrates example scenarios of lazy evaluation. In FIG. 6, the search engine 118 is evaluating a data stream 602 having a byte sequence comprising of the word "decompression". The current byte position 606 has a byte value equal "d". In this example, the history memory 116 has previously indexed byte pattern 614, 616, 618 which comprises the words "decompr.", "decompiler", and "decoded", respectively. The search engine 118 determines that data stream 602 matched a length of 7 (block 626) to word 614, a length of 6 (block 628) to word 616, and a length of 4 (block 618) to word 618. As a result, the search engine 118 selects word 614 ("decompr.") as the byte pattern "d-e-c-o-m-p-r" is the longest matching pattern (7 bytes). Under lazy evaluation, the search engine 118 delays outputting the match pattern and process subsequent positions for even longer matching pattern. In the illustrative embodiment, lazy evaluation for 2 subsequent bytes of the current byte 314 is performed. In this scenario, the search engine 118 further processes the next input bytes 608 and 610, which has the byte value of "e" and "c", respectively. Further assume in the scenario, the history memory 116 has also previously indexed byte pattern 612 and 620, which comprises the words "codec" and "compression", respectively. The search engine 118 determines the matches have a length of 3 (block 624) to word 612, and a length of 11 (block 632) to word 620. In delaying the output of length 7 to word 614, the search engine 118 has found a longer word 620. As a result, the search engine 118 selects word 620 and outputs a string, comprising a distance/offset value referencing to the starting location 642 of word 620 and a length value of 11. The distance and length value may vary if the reference frame of the data stream is changed.

The disclosure describes a system and a method to perform lazy evaluation. The search engine 118 further processes the operation of lazy evaluation for poor compressible datasets.

Figure 7:
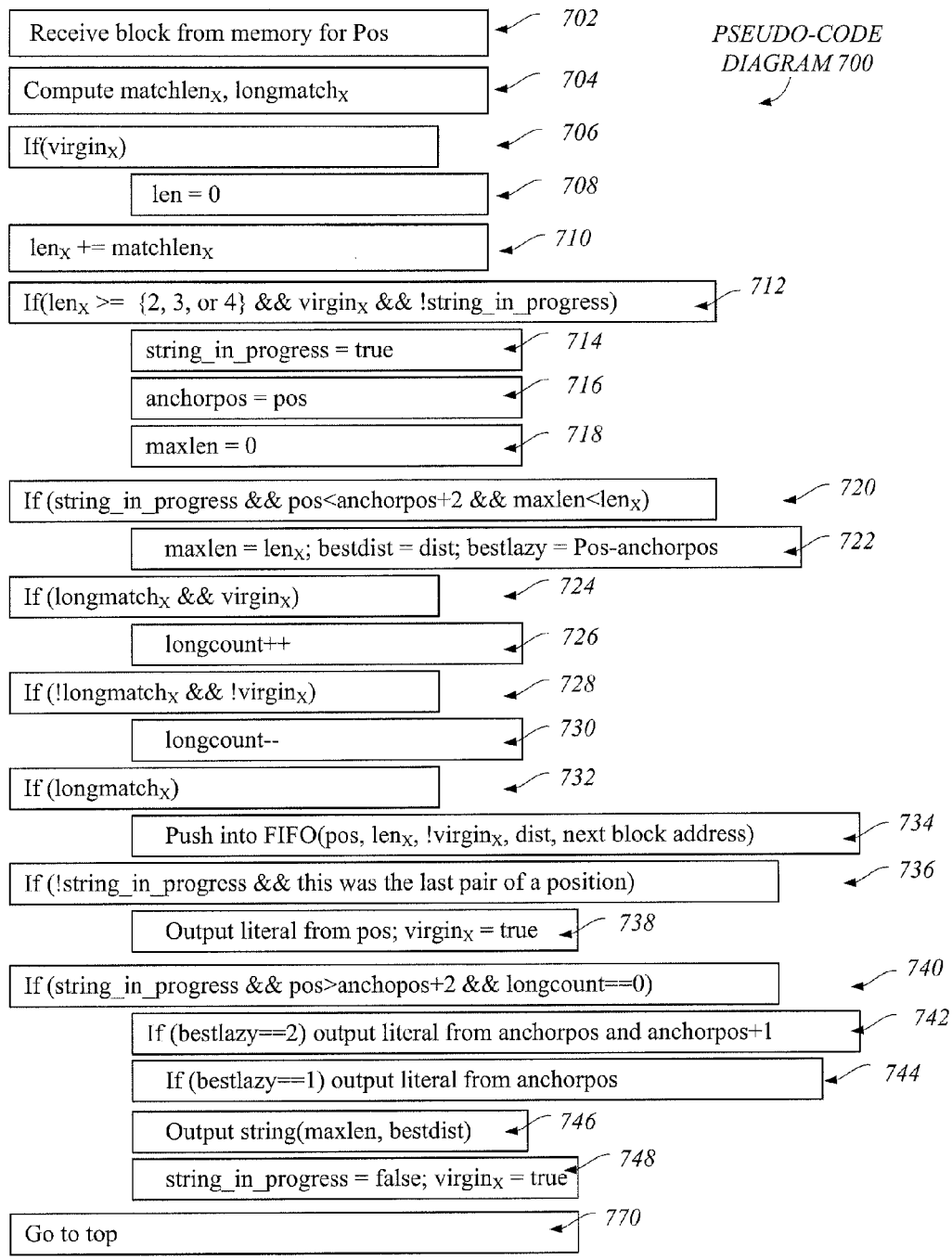
FIG. 7 is a pseudo-code diagram of the method in accordance with the illustrative embodiment.

The definitions of the variables and expression in FIG. 7 are provided as follows.

"matchlen_x" 912a, 912b are parameters indicating the longest matching sequence of bytes among the processed potential matches for the anchor_position and the lazy_positions. The notation x relates to a potential string match for an anchor_position or a lazy_position.

"longmatch_x" 914a, 914b are flags indicating a match where the full extent of the evaluation can not be determined based on the processing of block of data presented; specifically, the match reached the end of the block of data. The notation x relates to a potential string match for an anchor_position or a lazy_position.

"len_x" 916a, 916b are counters indicating the total length of a potential match. The notation x relates to a potential string match for an anchor_position or a lazy_position.

"maxlen" 924 is a counter indicating the longest matching string processed by the search engine for a given string search so far.

"long count" 928 is a counter indicating the number of in-flight long searches.

"best_dist" 930 is a parameter indicating the potential match having the best distance (e.g., longest match).

"virgin_x" is a flag indicating whether a potential matches has been processed at least once. The notation x relates to a potential string match for an anchor_position or a lazy_position.

"string_in_progress" is a flag indicating whether the processing of the potential matches for the anchor_position and the lazy_positions is under progress.

"Pos" is parameter indicating the current position being processed among the plurality of positions processed by the search engine 118 for a given string search.

"expression 1 && expression 2" is an expression for an AND operator between expression 1 and expression 2, where the result is "true" if both expression 1 and expression 2 are true.

"if(expression)" is a conditional expression where the content of the if condition is executed if expression is true. "if (expression1==expression2) indicates the condition is true if expression 1 equals expression 2.

"!parameter" is an indication of an inverse value of the parameter.

"parameter 1+=parameter 2" is an expression for an increment operator where parameter 1 is incremented by parameter 2.

"+", "−" are arithmetic functions.

">", "<" are comparison functions.

Speculation

The illustrative embodiment is configured for poor compressibility data sets. The system 100 speculates by assuming that in performing a search, a match will not be found. The search engine processes additional potential string matches, such as for lazy positions and position subsequent to lazy positions, as a result of speculating that the comparison does not result in a match, thus no output of a string.

As aspect of speculating is fetching of additional potential string matches before knowing the result of the previous memory fetches.

When the matches are known, three scenarios may occur.

In the first scenario, no matches are found in the evaluation of the anchor_position and the lazy_positions. In this scenario, the next byte position is already in-flight. The search engine 118 outputs a literal for the byte position. Alternately, no match condition may occur if no potential string matches is provided for the current byte position or if the matching potential string does not meet the minimum length.

In the second scenario, a short match is found. A short match refers to a match where the full extent of the match is determined based on the block of data presented for evaluation. In the embodiment, the short match is the result of match that does not extent past the memory row being compared.

In the third scenario, a long match is found. A long match refers to a match where the full extent of the evaluation cannot be determined based on the block of data presented for processing, such as when the search engine matches to the end of the block of data. Potential matches marked for further evaluation are put into a queue, referred to as the long FIFO, to allow the next potential match to be process without interruption. The search engine pushes the potential match into the long FIFO (code 734), including current_position ("pos"), length_x ("len$_x$"), virgin_x status ("!virgin_x"), distance ("dist"), and "next block address". As a result, the next potential string match presently in queue are not interrupted. In the embodiment where speculation is employed, a long match results in the speculative fetches being discarded and the processing for the next memory row is initiated.

Generally, a match exists to some extent when a comparison is performed because the potential match provided by the index engine 114 correlates to an indexed portion of the data stream 102 which are matching to some degree to bytes currently being searched.

Operation of Search Engine

Figure 4:
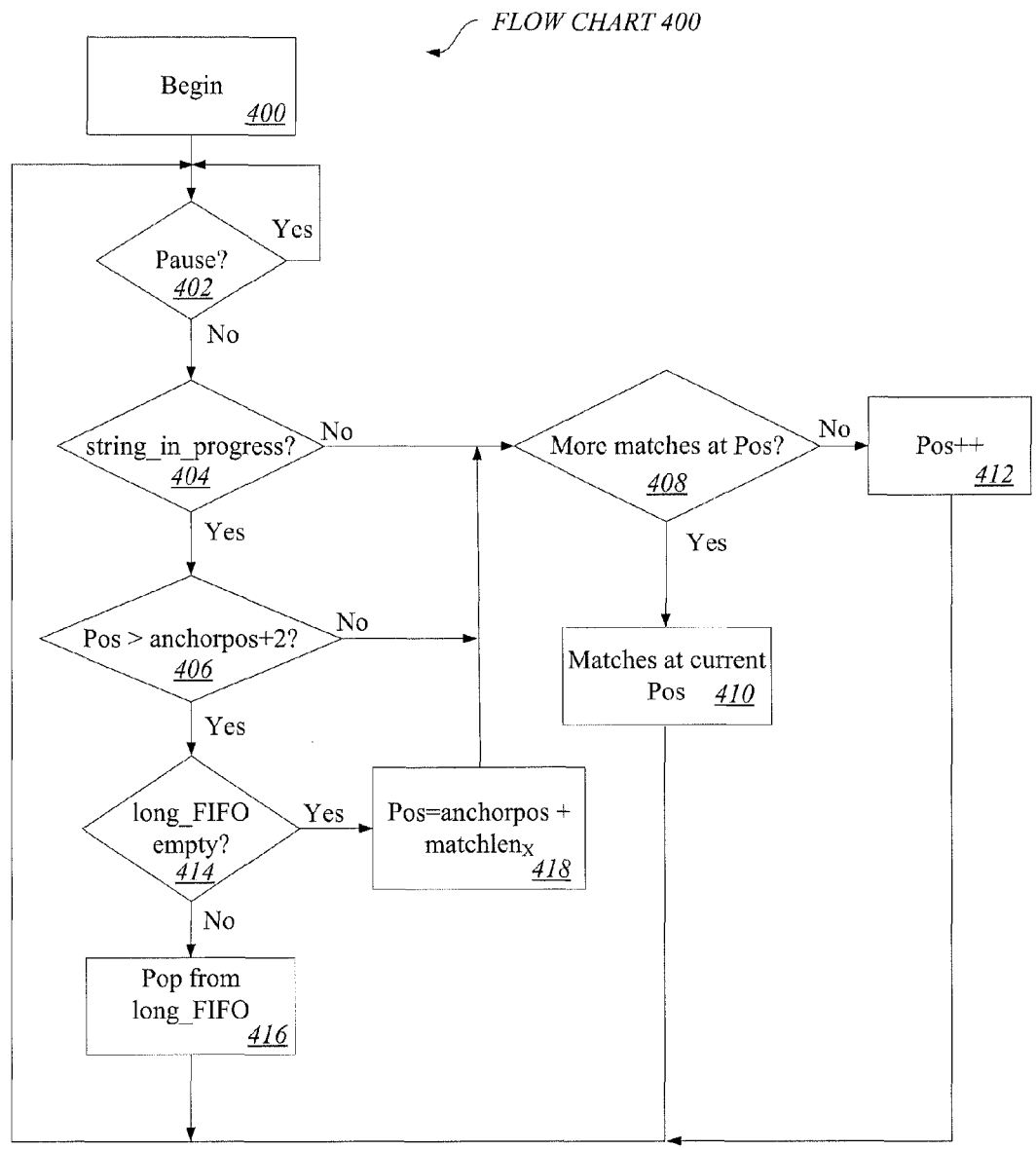
FIG. 4 is a flowchart of the method in accordance with the illustrative embodiment.

Referring to FIG. 4 and FIG. 7, the operation of the search engine 118 is discussed. FIG. 4 is a flowchart 400 of an aspect of the method 300 in accordance with the illustrative embodiment. FIG. 7 is a pseudo-code diagram illustrating another aspect of the operation of the search engine 118 in accordance with the illustrative embodiment.

The operation of the search engine 118 begins at an initialization state (block 400). During initialization, discrete and independent operations of circuitries within the search engine 118 are enabled. In the illustrative embodiment, the following circuitries are enabled, including the circuitries to present the current byte 106 to the index engine 114, to receive the potential matches 122 from the index engine 114, to fetch blocks of data from block of data 126 from the history memory 116 (code 702), and to compare the fetched block of data 126 to the current byte 106 and subsequent bytes 110 thereof. As a result, the search engine 118 computes the matchlen parameter and longmatch_x parameter for each fetched block of data (code 704). A len_x parameter for each potential match is incremented by the matchlen_x computed by the search engine 118 (code 710). The search engine determines if a virgin_x value is present (code 706) and reset len_x value to "0" (code 708) if such conditions are met.

Flowchart 400 illustrates the decision process of the search engine 118. Four operations are described, including the operation (1) for processing potential matches at the current byte 106 position ("anchor_position"); (2) for processing potential matches at a subsequent position ("lazy_position"); (3) for processing the full extent of the match; and (4) for determining a new anchor_position after the match.

In the first operation, processing of the potential matches at the anchor_position is discussed. In the first operation, the search engine 118 traverses through block 402, block 404, block 406, block 408, block 410, and back to block 402.

After initialization (block 400), the search engine 118 determines if a pause command exists (block 402). The pause command halts the search engine 118, for example, where the downward stream of the search engine 118 is congested to prevent further congestion until the pause command is cleared.

At block 404, the search engine 118 determines whether a string_in_progress flag is enabled.

At block 406, the search engine 118 determines if the current_position ("Pos") is greater than the anchor_position plus two positions ("AnchorPos+2"). As stated, the anchor_position is a starting position within the data stream that is being processed for a new string. The anchor_position refers the position of the current byte 106 within the data stream. As a result, the anchor_position plus two positions relates to the second position processed under lazy evaluation. It should be appreciated that more than two positions may be employed to provide more thorough lazy evaluation at a trade off of time and resources.

At block 408, the search engine 118 determines if more potential matches are available for the current_position. The index engine 114 generally provides a plurality of potential matches. The index engine 114 may provide no potential string match when no portions of indexed data stream are matching to the portions of the data stream being processed. In this scenario example, more potential matches are available. The search engine further determines whether the maxlen is less than the len_x ("maxlen_x<len_x") (code 720). If so, the maxlen parameter is set to len_x value ("maxlen=len_x"), the best_dist parameter is set to the dist value ("best_dist=dist"), and the best_lazy is set to current_position minus the anchor_position ("best_lazy=Pos—AnchorPos") (code 722).

At block 410, the search engine 118 increments to the next potential match for the current_position. The operation loops back to beginning of the operation at block 402.

In the second operation, processing of potential matches at subsequent position ("lazy_position") is discussed. In the second operation, the search engine 118 traverses through block 402, block 404, block 406, block 408, block 412, and back to block 402.

The search engine 118 determines there is no pause command (block 402). The search engine 118 determines the string_in_progress flag is enabled (block 404). The search engine 118 determines the current_position is less than the anchor_position plus two positions ("Pos<anchorpos+2") (block 406).

At block 408, the search engine 118 now determines no additional potential match are available at current_position.

At block 412, the search engine 118 increments the current_position. If the current_position was the anchor_position, the current_position becomes the next subsequent byte position after the anchor_position ("lazy_position 1"). If the current current_position was the lazy_position 1, the current position becomes the lazy_position 2. The operation loops back to beginning of the operation at block 402.

In the illustrative embodiment, two lazy_positions are processed, comprising lazy_position 1 and lazy_position 2. The search engine 118 may processed more than two lazy_positions to provide more thorough searching of the data stream.

In the third operation, processing of the full extent of the matches is discussed. In the third operation, the search engine 118 traverses through block 402, block 404, block 406, block 416, and back to block 402.

The search engine 118 determines there is no pause command (block 402). The search engine 118 determines the string_in_progress flag is enabled (block 404).

At block 406, the search engine 118 now determines the current_position is greater than the anchor_position plus two positions (e.g., Pos>AnchorPos+2). The result indicates that the search engine 118 has completed processing of the potential string matches for current byte 106 position and some subsequent positions thereof for lazy evaluation (including anchor_position, the lazy_position 1, and the lazy_position 2).

At block 416, the search engine 118 determines whether the long FIFO is empty. As stated above, if a long match is found, the search engine 118 pushes the match into the long FIFO for further processing. In this scenario, the search engine 118 determines the long FIFO is not empty.

At block 416, the search engine 118 pops the stored information of the stored long match from the first element within the long FIFO. Pop refers to retrieving the oldest element from the FIFO buffer. The operation loops back to beginning of the operation at block 402. The search engine 118 repeats the third operation until the long FIFO is empty.

In the fourth operation, determining a new anchor_position is discussed. In the fourth operation, the search engine 118 completed processing of the potential string match for the anchor_position, the lazy_positions, and the long FIFO. The search engine now determines and updates the anchor_position. In the fourth operation, the search engine traverses through block 402, block 404, block 406, block 414, block 418, block 408, block 412, and back to block 402.

The search engine 118 determines there is no pause command (block 402). The search engine 118 determines the string_in_progress flag is enabled (block 404). The search engine 118 determines the current_position is greater than the anchor_position plus two positions (e.g., Pos>AnchorPos+2) (block 406).

At block 414, the search engine 118 now determines the long FIFO is empty.

At block 418, the search engine 118 determines and updates pos=anchor_position plus the length of the matching string ("matchlen_x"). In the illustrative embodiment, the matchlen_x is the longest matching sequence of bytes among all the processed potential matches for a given string search. The anchor_position is incremented by the matchlen value ("AnchorPos+=matchlen). Additionally, the condition (code 740) for string_in_progress being true ("string_in_progress") and current_position greater than anchor_position plus two position ("Pos>anchorpos+2) and longcount equal 0 (longcount=0) is met. As a result, the search engine 118 outputs the string comprising of maxlen and best_dist with function Output_string(maxlen, best_dist) (code 746). The search engine 118 may further output a literal for anchor_position if the best_lazy is determined to be "1" (code 744). The search engine 118 may further output a literal for the anchor_position and the lazy_position 1 if best_lazy is determined to be "2" (code 742). The string_in_progress parameter is also set to "false" or "0" (code 748). As stated above, best_lazy is determined at block 408 when maxlen is less than the len_x.

Subsequently, the search engine 118 loops back to the top ("Go to top") (code 770). At the next cycle, the search engine 118 resets the parameters for the next string processing (code 712) as condition of len_x greater than minimum length value ("len_x>{2,3,4}") and first pass ("virgin_x") and string not in progress ("!string_in_progress") are met. The expression {2,3,4} refers to a configurable value for the minimum length value. In the illustrative embodiment, the minimum length value is set to either 4. The search engine 118 then executes code 714, 716, and 718. In code 714, 716, 718, the search engine 118 set the string_in_progress parameter to "true" ("string_in_progress=true"), set the anchor_position to the last current position ("anchorpos=pos"), and reset the maxlen parameter to "0" ("maxlen=0").

The search engine pass through state 408 (no more potential matches available for the current_position) and increments the current position by to the next position (block 412). Alternatively, the current position may be set to the new anchor_position. The search engine 118 continues processing the data stream until the end of the data stream is reached or until specified to stop.

A no match condition may be determined based on the search engine 118 determining a condition of string_in_progess being false ("!string_in_progress") at block 406 and no more matches at the current_position ("Pos") at block 408 (codes 736 and 738).

A short match results in not longmatch_x condition (e.g., "!longmatch_x") or longmatch value equal "0" or "false".

If a long match is found (longmatch_x parameter equals "1" or "true"), the search engine 118 marks the match for further evaluation. When the search engine 118 is processing a potential match for the first time (code 724), the longcount parameter is incremented by one ("longcount++") (code 726).

Exemplary Example of Operation of Search Engine

Figure 9A:
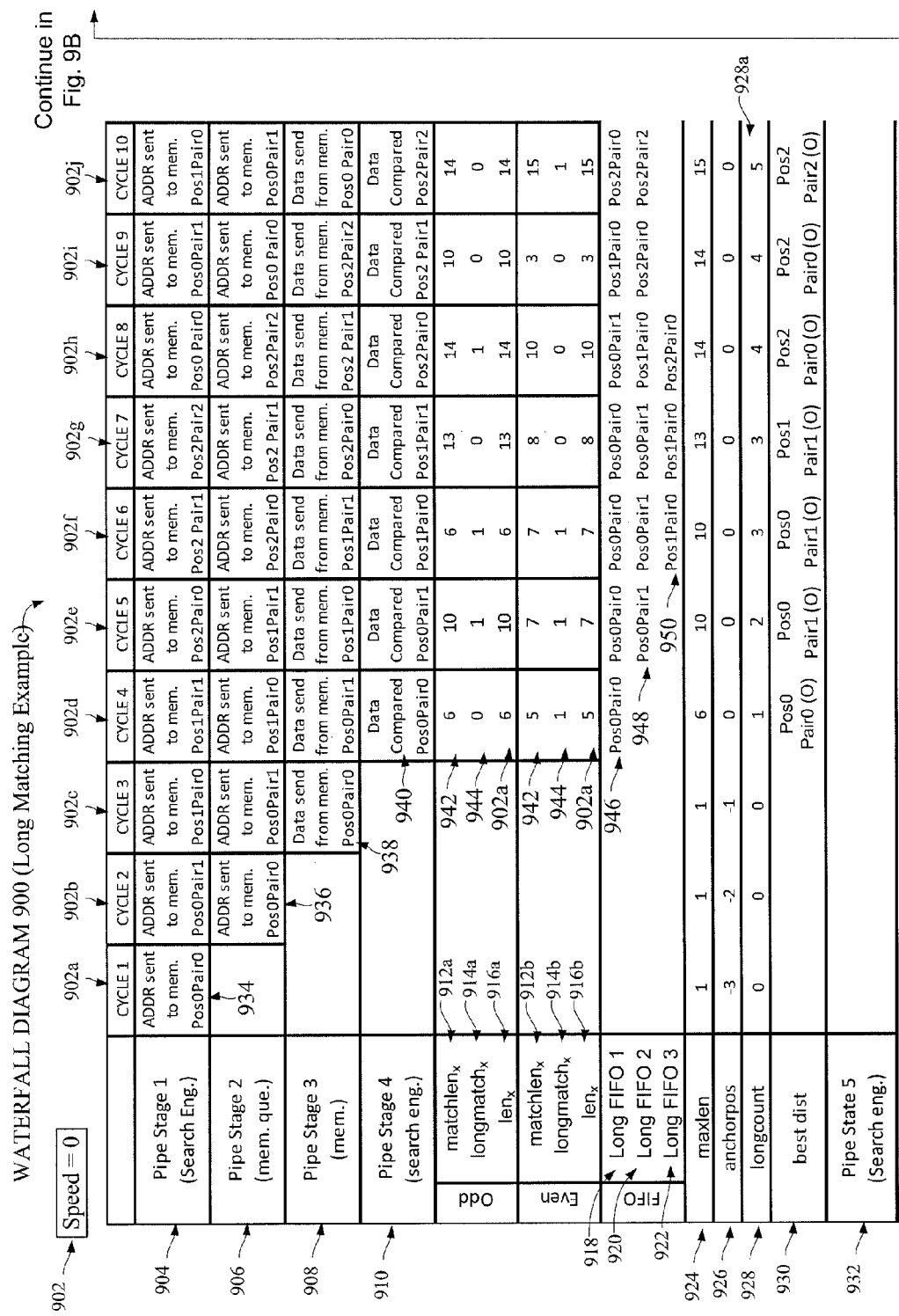
FIG. 9A is a first portion of a water fall diagram illustrating the operation of the search engine at a nominal speed in accordance with the illustrative embodiment.
Figure 9B:
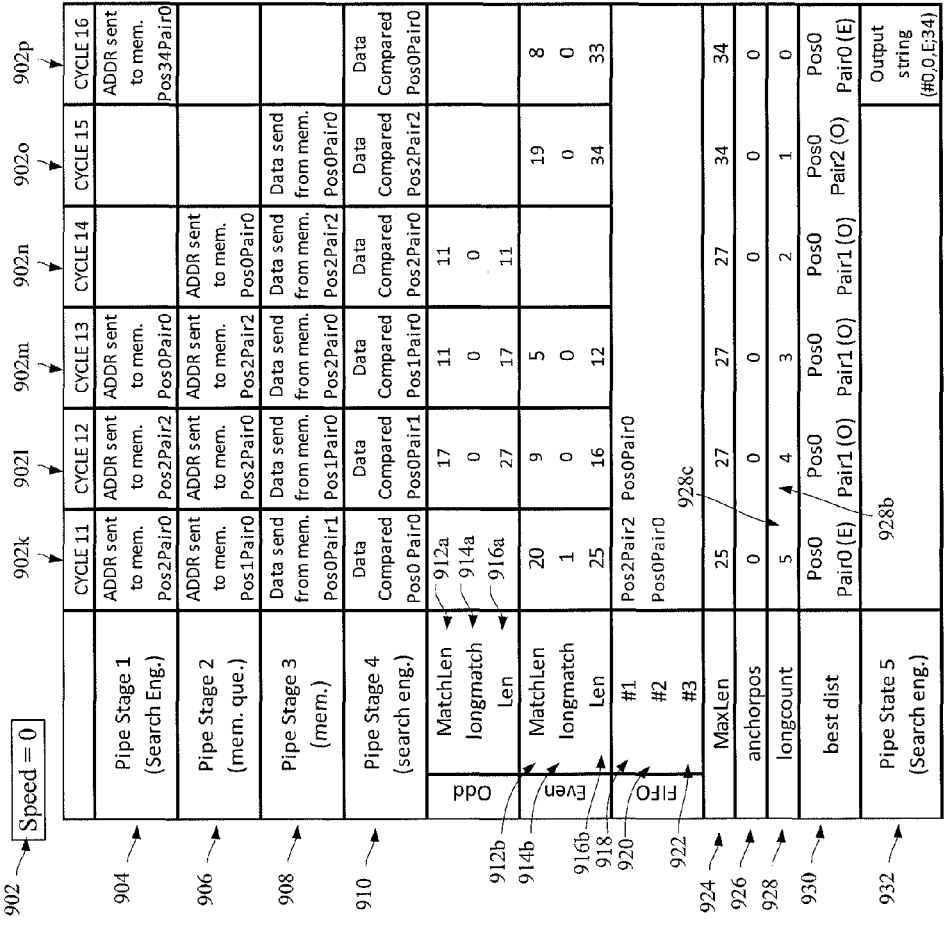
FIG. 9B is a second portion of a water fall diagram illustrating the operation of the search engine at the nominal speed in accordance with the illustrative embodiment.

The exemplary operation of the search engine 118 is now discussed with reference to FIG. 9A and FIG. 9B. FIG. 9A is a first portion of a water fall diagram illustrating an operational scenario of the engine at a nominal speed in accordance with the illustrative embodiment. FIG. 9B is a second portion of a water fall diagram illustrating an operational scenario of the engine at a nominal speed in accordance with the illustrative embodiment.

In FIG. 9A and FIG. 9B, waterfall diagram 900 is illustrated in a series of time period 902a-902p in the x-axis. The y-axis illustrates various pipe stages in the system 100 (904, 906, 908, 910, 918, 920, 922, 932), variables for a given string search (912, 914, 916, 924, 928), and variables for the data stream (926, 930).

The waterfall diagram 900 is illustrated with banked configurations for the index engine 114, the history memory 116, and the search engine 118 to allow for parallel operations with more throughputs.

In FIGS. 9A and 9B, Pipe_Stage_1 (904), Pipe_Stage_4 (910), Pipe_Stage_5 (932), long_FIFO_1 (918), long_FIFO_2 (920), and long_FIFO_3 (922) are modules in the search engine 118. Pipe_Stage_2 (906) and Pipe_Stage_3 (908) are modules in history memory 116.

Pipe_Stage_1 (904) fetches the blocks of history data 126 by sending memory address 128 associated to the potential matches to the history memory 116.

Pipe_Stage_2 (906) functions as a FIFO queue to the history memory 116.

Pipe_Stage_3 (908) provides the block of data 126 from the history memory 116 to the search engine 118.

Pipe_Stage_4 (910) receives the block of history data 126 from the history memory 116 and compares the blocks to the current byte 126 and subsequent bytes thereof.

Pipe_Stage_5 (932) outputs the string upon matching consecutive bytes in the block to the current byte and subsequent bytes thereof after the processing of the potential matches and the full extent of the matching is completed.

The search engine 118 receives a speed parameter 902 which limits the number of potential string matches processed by the search engine 118.

"long FIFO 1" 918, "long FIFO 2" 920, and "long FIFO 3" 922 are parameters of potential match pushed into the long FIFO queue due to being a long match. In the illustrative embodiment, the long FIFO are configured to hold all the information of a potential match to reduce processing, including, but not limited to, current_position ("pos"), length_x ("len$_x$"), virgin_x status ("!virgin_x"), distance ("dist"), and "next block address".

Operation for Speed=0

The operation of the system 100 at control input speed="0" is now discussed. In the illustrative embodiment, control input speed="0" refers to a best compression quality with up to 3 potential string match pairs 224, 226, 228 being processed.

In Cycle 1 (902a) to Cycle 7 (902g), Pipe_Stage_1 (904) fetches the blocks of history data (shown starting at 934) for potential matches of Pos0Pair0 (902a), Pos0Pair1 (902b), Pos1Pair0 (902c), Pos1Pair1 (902d), Pos2Pair0 (902e), Pos2Pair1 (902f), and Pos2Pair2 (902g). The nomenclature for Pos_x_Pair_y refers to Position x Pair y, where Position 0 is anchor_position, Position 1 is lazy_position 1, and Position 2 is lazy_position 2. Pair refers to potential matches available at that location, thus Pos0Pair0 refers to the first potential match at anchor_position, and Pos2Pair2 refers to the third potential match at lazy_position 2. "ADDR send to mem." refers to the outbound direction of information from the search engine 118 to the history memory 116. In Cycle 1 (902a) to Cycle 2 (902b), the potential matches for the anchor_position are first processed as described in the first operation at FIG. 4. Subsequently, the potential match for lazy_position 1 and lazy_position 2 processed (Cycle 3 to Cycle 7) as described in the second operation at FIG. 4.

In Cycle 2 (902b) to Cycle 8 (902h), Pipe_Stage_2 (906) queues the fetched memory requests (shown starting at 936) for potential matches of Pos0Pair0 (902a), Pos0Pair1 (902b), Pos1Pair0 (902c), Pos1Pair1 (902d), Pos2Pair0 (902e), Pos2Pair1 (902f), and Pos2Pair2 (902g).

In Cycle 3 (902c) to Cycle 9 (902i), Pipe_Stage_3 (908) provides the block of data 126 to the search engine 118 (shown starting at 938). "Data send from mem-+." refers to the inbound direction of information from the history memory 116 to the search engine 118.

In Cycle 4 (904d) to Cycle 10 (902j), Pipe_Stage_4 (910) receives the block of history data 126 and compares the blocks to the current byte 126 and subsequent bytes thereof (shown starting at 940). "Data Compared" refers to the comparison performed by Pipe_Stage_4. For example, Pos0Pair0 refers to Pipe_Stage_4 comparing the block of data of the first potential match of anchor_position with the current byte 106 and subsequent bytes thereof.

longmatch_x (914a, 914b), long_FIFO (918, 920, 922), and longcount (928) are described together to illustrate the operation of the long FIFO. longmatch_x (914a, 914b) indicate whether the match extended to the end of the block of data (shown starting at 944), where "1" indicates a long match, and "0" indicates a short match. "x" refers to a potential match pair. In the bank configuration, a long match for either pair of the potential match results in a long match for the potential match. A long match for a potential match results in the potential match being pushed into the long FIFO. In this example, Pos0Pair1_odd, Pos0Pair1_even, Pos1Pair0_odd, Pos1Pair0_even, Pos2Pair0_odd, and Pos2Pair2_even are long matches. The nomenclature of "odd" and "even" relates to the bank operation of the search engine, thus Pos0Pair1_odd refers to the second potential match pair of the anchor_position at the odd pair. Similarly, Pos1Pair0_even refers to the first potential match pair of the lazy_position 1 at the even pair.

When Pipe_Stage_4 determines a long match for the potential match, it pushes the potential matches into the long FIFO. For example, at Cycle 4 (902d), Pipe_Stage_4 determines a long match for Pos0Pair0_even, thus Pos0Pair0 is pushed into long_FIFO_1 (918) (shown at 946). As a result, longcount (928) is incremented to "1". Similarly, in Cycle 4 (902e), Pipe_Stage_4 determines a long match for Pos0Pair1_odd and Pos0Pair1_even, thus Pos0Pair1 is pushed into long_FIFO_2 (920) (shown at 948). As a result, longcount 928 is incremented to "2". In this scenario, the maximum longcount (928) value is "5" (928a) as a result of the long matches found for the Pos0Pair0, Pos0Pair1, Pos1Pair0, Pos2Pair0, and Pos2Pair2.

If the search engine 118 determines a short match for the potential match x and it is the not the first time evaluating the potential match ("!virgin_x"), the search engine 118 decrements the longcount parameter (e.g., "longcount—") (code 730). As a result, the longcount (928) decrements after a potential pair popped from the long FIFO is processed and the comparison at Pipe_Stage_4 is completed. In this scenario, the longcount (928) is decremented at block 928b as a result of the Pos0Pair1 being processed and a short match is determined and the processing was not the first time evaluating Pos0Pair1. At Cycle 11, although PosPair0 was already processed (928c), a long match was determined for Pos0Pair0, thus longcount (928) did not decrement. The longcount (982) decrements to a value of "0" at Cycle 16 as a result of subsequent processing of Pos1Pair0, Pos2Pair0, Pos2Pair2, and Pos0Pair0.

Matchlen_x (912*a*, 912*b*), len_x (916*a*, 916*b*), MaxLen (924), and best_dist (930) are described together to illustrate the determining of the length value. Matchlen_x (912*a*, 912*b*) show the results of the processing (shown starting at 942). The result of 912*a* (value=6, 10, 6, 13, 14, 10, 14) and 912*b* (value=5, 7, 7, 8, 10, 3, 15) indicate the matching length value between the block of data and the current byte 106 and subsequent bytes 110. In this example, each block of data received comprises 20 bytes.

Len_x (916*a* and 916*b*) show the total length of a potential match for each banked operation. The result of 916*a* (6, 10, 6, 13, 14, 10, 14) and 916*b* (5, 7, 7, 8, 10, 3, 15) are equivalent to matchlen_x (912*a*) in the first processing operation of the potential matches. The len_x (916*a*, 916*b*) are incremented as the potential matches are processed further.

Maxlen (924) maintains the current value of the longest matching string. Maxlen (924) is initialized at a value of "1". At Cycle 4 (902*d*), Pipe_Stage_4 determines a len_x (916*a*) value of "6" for Pos0Pair0_even. As a result, maxlen (924) is incremented to "6". Additionally, best_dist (930) stores the potential match Pos0Pair0_even. Similarly, at Cycle 5 (902*e*), Pipe_Stage_4 determines a len_x (916*a*) value of "10" for Pos0Pair1, thus maxlen (924) is incremented to "10". Best dist (930) stores the potential match Pos0Pair1_odd. At the end of Cycle 10 (902*j*), maxlen (924) has a value of "15" and best_dist (930) stores potential match Pos2Pair2_odd.

anchorpos 926 is initialized at a value of "−3" at Cycle 1 (902*a*). The scenario illustrates 3 literals having preceded the string matching operation. The scenario is shown with the anchorpos equal "0" when the processing for the current string is initiated.

As illustrated, the search engine 118 processes the anchor_position and the lazy_positions concurrently in parallel operations. Subsequent to the search engine 118 processing the potential matches of the anchor_position and the lazy_position, the full extent of the matches are then processed, such as described in the third operation in FIG. 4.

At Cycle 8 (902*h*) to Cycle 12(902*l*), Pipe_Stage_1 (904) fetches blocks of potential matches that require further processing by popping the potential matches from the long FIFO, including Pos0Pair0, Pos0Pair1, Pos1Pair0, Pos2Pair0, and Pos2Pair2.

At Cycle 9 (902*i*) to Cycle 13 (902*m*), Pipe_Stage_2 (906) queues the fetched memory requests for next memory block of Pos0Pair0, Pos0Pair1, Pos1Pair0, Pos2Pair0, and Pos2Pair2. At Cycle 8 (902*h*), Pos0Pair0 is popped from long_FIFO_1 (918), resulting in the Pos0Pair1 moving up the queue from long_FIFO_2 (920) to long_FIFO_1 (918).

At Cycle 10 (902*j*) to Cycle 14 (902*n*), Pipe_Stage_3 (908) at the history memory 116 provides the next block of data to the potential match of Pos0Pair0, Pos0Pair1, Pos1Pair0, Pos2Pair0, and Pos2Pair2.

Pipe_Stage_4 receives the resulting subsequent block for Pos0Pair0, Pos0Pair1, Pos1Pair0, Pos2Pair0, and Pos2Pair2 at Cycle 11 (902*k*) to Cycle 15 (902*o*). Pipe_Stage_4 utilize the stored information of the long matching bank, thus only performs the matching to the applicable bank.

At Cycle 11 (902*k*), Pipe_Stage_4 determines a longmatch_x (914*b*) having a matching length 912*b* of "20". As a result, the len_x (916*b*) is incremented from the previous value of "5" to a new value of "25". The maxlen (924) is then incremented from "15" to "25" and best_dist 930 is updated to Pos0Pair0_even. As a result of the long match, Pos0Pair0 is put into the long FIFO, specifically, long_FIFO 2.

Pipe_Stage_4 processes Pos0Pair1, Pos1Pair0, Pos2Pair0, Pos2Pair2 at Cycle 12 (902*l*) to Cycle 15 (902*o*). As a result, the maxlen (924) has a value of "34" and best_dist value pointing to Pos0Pair0_even.

At Cycle 13 (902*m*), the Pos0Pair0 is popped from the long FIFO for further matching. Pipe_Stage_4 processes the second subsequent block of data for Pos0Pair0 at Cycle 16 (902*p*). Pipe_Stage_4 determines a matchlen of "8", the len_x (916*b*) is incremented from "25" to "33".

At Cycle 16 (902*p*), the string processing is completed, e.g., the long FIFO queue is empty and there are no more potential matches for the anchor_position, and the lazy_positions. The condition of string_in_progress is still true, the current_position ("pos") is greater than the anchorpos+2, and the longcount value is zero is satisfied (740). As a result, Pipe_Stage_5 (of the search engine 118) outputs the string with a distance value from the anchor_position to the starting position of Pos2Pair2 and a length value of "34". Pipe_Stage_1 then fetches the blocks of history data for potential matches of Pos34Pair0.

Operation for Speed=2

The control input 120 limits the number of potential string matches that may be searched by the search engine 118 to allow the system 100 to vary the throughput of the system 100 by trading off compression quality in having a less thoroughly searched data stream. FIG. 8 illustrates the same scenario (e.g. same potential matches, current byte, data stream, and anchor_position) of FIGS. 9A and 9B with a speed parameter equal "2", which results the search engine 118 processing only one potential string match. As a result, the search engine 118 merely processes Pos0Pair0, Pos1Pair0 and Pos2Pair0, while ignoring/skipping potential matches for Pos0Pair1, Pos1Pair1, Pos2Pair1 and Pos2Pair2. In the illustrative embodiment, the search engine 118 does not fetch the ignored/skipped potential matches.

Speculation is further illustrated in FIG. 8. At stated, in combination with pipeline operation, the speculation may provide the benefit of keeping the pipeline full in being able to process additional searching processes when the pipeline is not busy. At Cycle 4 (802*d*), Cycle 8 (802*h*), Cycle 10 (802*j*), and Cycle 11 (802*k*), additional subsequent positions are processed by the search engine 118. In the scenario where no matches is found, the processing of additional subsequent position provides for improve searching time, thereby improving throughput for poor compressibility datasets.

In alternate embodiment, the search engine 118 or the control input 120 may set limits to the number of potential matches that are provided by the index engine 114 to the search engine 118.

In another alternate embodiment, the search engine 118 may receive the potential matches, fetches the block of data using the potential matches, and determine not to process the fetched block of data.

In the scenario of FIG. 8, the search engine 118 processes only one potential match pair. As a result, the processing of the potential matches for the anchor_position, the lazy_positions, and the full extent of the matching is performed at Cycle 1 (902*a*) to Cycle 10 (902*j*), which is nearly a 25% reduction from the processing of up to three potential match pairs for each position. As a result, the resulting string processed at speed "2" has a distance value to Pos0Pair0_even and a length value of "33", which is a 3% reduction in length. It should be appreciated that the example is provided merely for illustrative purposes and the compressibility of datasets is highly dependent on the structure of the data and the repeatability within such data structure. The example illustrates that improving the throughput of the search engine by reducing the thoroughness of the search does not result in a linear reduction in the overall compressibility of the data stream.

Encoder

Referring again to FIG. 1, the search engine 118 provides searched output to an encoder 138. The encoder 138 substitutes the output of the search engine 118, including description of repeating data pattern 134 and non-repeating data pattern 136, with symbols to output an encoded data stream 104.

In the illustrative embodiment, the encoder 138 substitutes repeating data pattern 134 (e.g., strings) and non-repeating data-pattern (e.g. literals) with either optimized or fixed Huffman symbols in accordance with the DEFLATE protocol. In alternate embodiments, the encoder 350 may substitute the output of the search engine with symbols in accordance with Lempel Ziv Stac (LZS) protocols.

Banked Memory Operation

Figure 5:
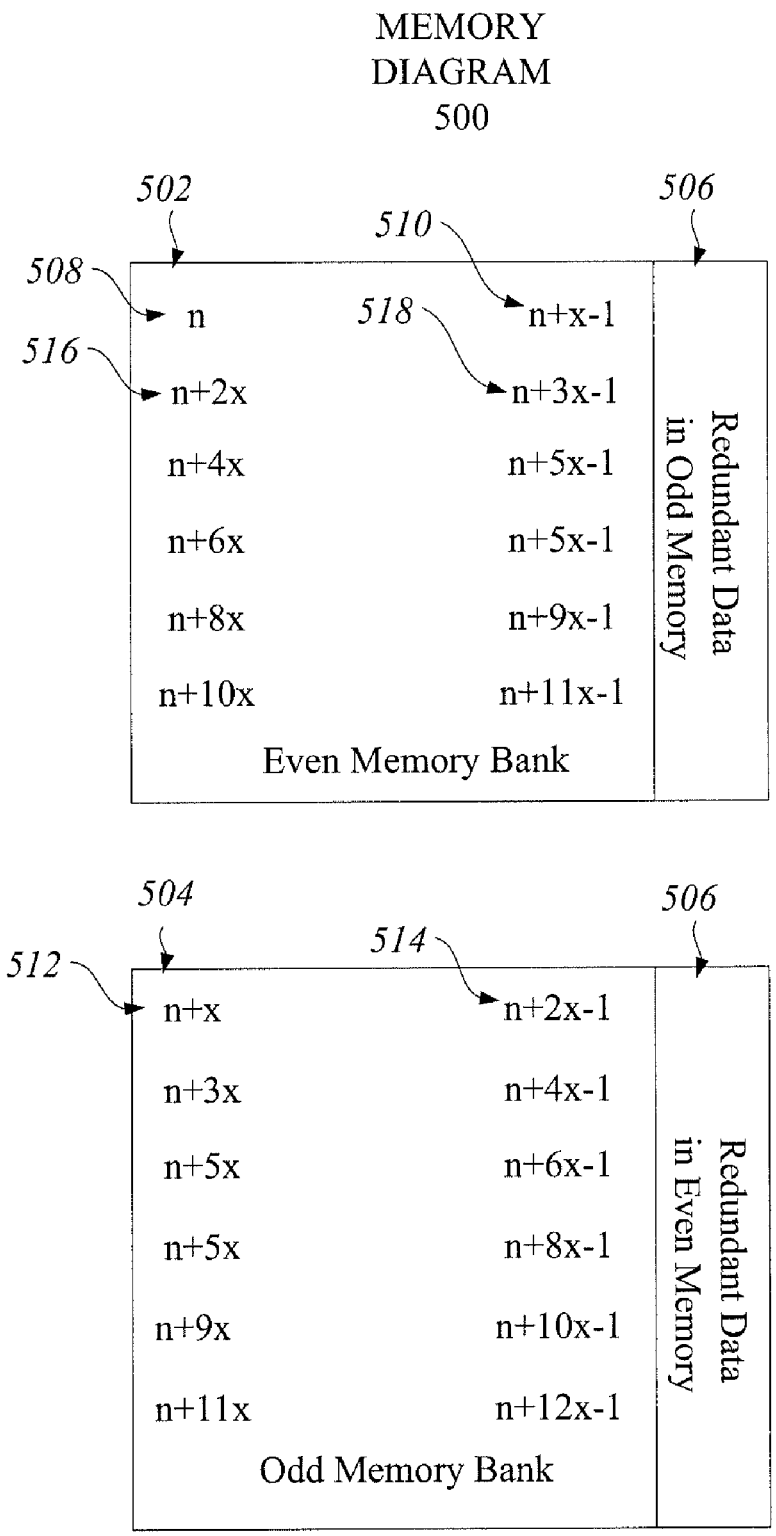
FIG. 5 is a diagram of history memory configurations in accordance with the illustrative embodiment.

In the embodiment where banked memory is utilized, the odd and even memory banks are alternated between the processing. FIG. 5 illustrates a diagram of banked history memory 118 in accordance with the illustrative embodiment. In FIG. 5, two memory banks 502 and 504 are shown having interleaving memory addresses for the byte positions. The memory banks are further provided with redundant data 506 from the opposing interleaved memory. As a result, for example, the first row of memory bank 502 comprising of location "n" (508) to "n+x−1" (510) further comprises a portion of the first row of memory bank 504, such as a portion of location "n+x" (512) to "n+2x−1" (514). Similarly, the first row of memory bank 504 further comprises a portion of the second row of memory bank 502, such a portion of location "n+2x" (516) to "n+3x−1" (518). The value "n", in this instance, relates to the beginning of the physical address of the memory. The value "x", in this instance, relates to a length of each row in the memory. In the illustrative embodiment, the memory module comprises of 16 bytes of memory and 4 bytes of redundant data, thus "x"=16.

The banked operation provides for parallel access of the memory improving the throughput of the search engine 118. It should be appreciated that the various memory schemes discussed may be implemented in combination with other memory schemes, or may be implemented independently.

Scenario of the System

Figure 10:
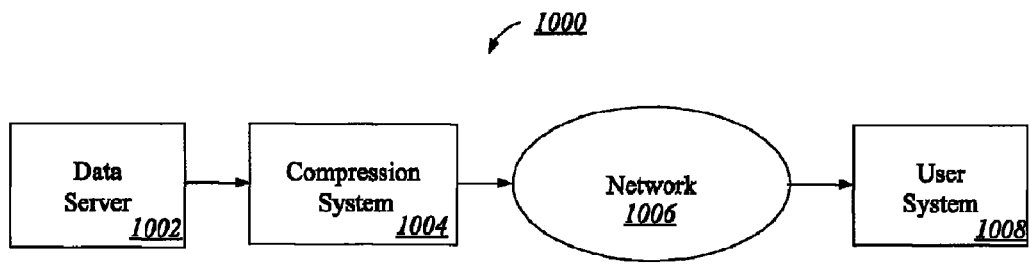
FIG. 10 is a diagram of an exemplary configuration utilizing the system in accordance with an illustrative embodiment.

FIG. 10 is a diagram of an exemplary configuration 1000 utilizing the system in accordance with an illustrative embodiment. Configuration 100 comprises a data server 1002, a compression system 1004, a network 1006, and a user system 1008.

Data server 1002 is a computer server that provides database services to other computer programs, computers, or servers. The data server 1002 is typically accessed through a "front end" running on the user's computer which displays requested data or the "back end" which runs on the server and handles tasks such as data analysis and storage. Examples of database servers include Oracle, DB2, Informix and SQL Server. Data server 1002 may be employed by organizations within a private network or operatively linked to an open network, such as the Internet. Data server 1002 may be coupled to a networked communication system that aggregates communication data stream from network stations, such as for mobile communication.

Compression system 1004 is a processing unit that encodes information. The compression system 1004 may be implemented in whole or in part as a computer, a server, or a device employing the following as its processing unit, including an application specific integrated circuit (ASIC), a field-programmable gate array (FPGA), microprocessors, digital signal processors, and other digital circuitry. The various processing units may employ cell-based architecture, such as cell-based ASICs, and cell-based processors.

Network 1006 is a communication link between the data server 1002 and the user system 1008. Network 1006 generally relates to, but is not limited to, the physical, transport, and application layers to deliver data. Network 106 may be the physical and transport layer for a synchronous optical networking (SONET), asynchronous transfer mode (ATM) system, and other telecommunication network.

User system 1008 is an end user device, such as, but is not limited to, user computer, data servers that is providing information to another user system, and backup storage devices. The user system 1008 can further be, but is not limited to, mobile devices, such as laptop, mobile phones, tablet computers, tablet hand-held devices and portable e-book readers.

It should be appreciated that the flow of data is merely illustrated from the data server 1002 to user system 1008. The data from the user system 1008 may be transmitted to the data server 1002. The data may be encoded with a compression system similar to system 1004.

Figure 11:
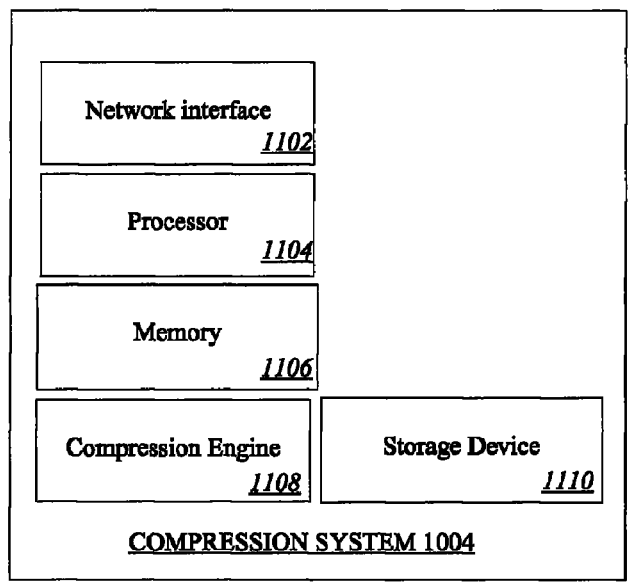
FIG. 11 is a diagram of the compression system in accordance with the illustrative embodiment.

FIG. 11 is a diagram of the compression system 1104 in accordance with the illustrative embodiment of FIG. 1. The compression system 1104 comprises a network interface 1102, processor 1104, a memory 1106, a compression engine 1108, and a storage device 1110.

In the illustrative embodiment, the network interface 1102 receives data. The data may be received from a communication system, from a network, or from within the compression system 1004. The processor 11042 may comprises a direct memory access (DMA) engine. The processor or the DMA engine directs the data from the network interface 1102 to the storage device 1110. When encoding, the processor or DMA engine provides the data from the storage device to the compression engine 1108.

In alternate embodiment, the data is presented to the compression engine 1108 directly from the network interface 1102, thus bypassing the storage device 1110.

Various encoding algorithms may be implemented with the compression engine disclosed herein. It should be understood that the compression engine can implement compression algorithm beyond DEFLATE and LZS, which are shown for the spirit of the invention.

Similarly, it should be understood that the various parameters disclosed are illustrative embodiments and may be modified without affecting the spirit of the invention. For example, the potential number of matches, the various sizes memory, the number of pipeline changes, and banking scheme may vary.

While the invention has been shown and described with reference to certain example embodiments thereof, it will be understood by those skilled in the art that various changes in form and details may be made therein without departing from the spirit and scope of the disclosure as defined by the appended claims.

What is claimed is:

1. A system comprising:
   an input port receiving a data stream having a current byte and a stream of preceding and subsequent bytes thereof;
   a history memory storing the stream of preceding bytes in blocks of history data;
   an index engine having a table of keys associated to memory addresses of the blocks, the index engine accessing the table to output a plurality of potential string matches upon entry of the current byte;

a search engine processing the potential string matches by fetching the blocks of history data associated with each of the plurality of potential string matches and comparing a portion of each of the blocks to the current byte to output a string upon matching consecutive bytes in the block to the current byte and subsequent bytes thereof; and a control input limiting the number of potential string matches processed by the search engine by directing the search engine to skip fetching at least one block of history data associated to the potential string match based on the control input.

2. The system of claim 1 further comprising:
a FIFO storing a description of the match that extends beyond the compared fetched block of history data.

3. The system of claim 2 wherein the search engine fetches the block of history data associated to the plurality of potential string matches prior to fetching a next block of history data using the stored description of the match that extended beyond the compared block of history data.

4. The system of claim 3 wherein the fetched block of history data comprises redundant data from another block of memory.

5. The system of claim 4 wherein the block of memory data is redundant to a subsequent block of memory.

6. The system of claim 1 wherein the memory is banked, the search engine fetching a second block of history data when fetching the block of memory data.

7. The system of claim 6 wherein the search engine compares the second block of history data to current byte when comparing the block of history data.

8. The system of claim 1 wherein the index engine comprises a cyclic redundancy check (CRC) module and a hash table.

9. The system of claim 1 further comprising:
an encoder encoding the string with a symbol correlated to the frequency of repetition of the string.

10. The system of claim 9 wherein the symbol comprises Huffman symbols.

11. The system of claim 1 wherein the index engine accesses the table to output the plurality of potential string matches based upon a plurality of bytes, including the current byte and at least one consecutive byte thereof.

12. The system of claim 1 wherein the search engine outputs a literal when the matched bytes are less than a predetermined length.

13. The system of claim 1 wherein the index engine outputs a first set of potential string matches for the current byte and a second set of potential string matches for at least one consecutive byte of the current byte, the search engine processing the first set of potential string matches and the second set of potential string matches prior to outputting the string.

14. A system comprising:
an input port receiving a data stream having a current byte and a stream of preceding and subsequent bytes thereof;
a history memory storing the stream of preceding bytes in blocks of history data;
an index engine having a table of keys associated to memory addresses of the blocks, the index engine accessing the table to output a plurality of potential string matches upon entry of the current byte;
a search engine processing the potential string matches by fetching the blocks of history data associated with each of the plurality of potential string matches and comparing a portion of each of the blocks to the current byte to output a string upon matching consecutive bytes in the block to the current byte and subsequent bytes thereof; and
a control input limiting the number of potential string matches processed by the search engine by directing the search engine to skip comparing at least one fetched block of history data associated to the potential string match based on the control input.

15. A method comprising:
receiving a data stream having a current byte and a stream of preceding and subsequent bytes thereof;
storing the stream of preceding bytes in blocks of history data;
processing a table to output a plurality of potential string matches upon entry of the current byte, the table having keys associated to addresses of stored history data;
processing the potential string matches by fetching the blocks of history data associated with each of the plurality of potential string matches and comparing a portion of each of the blocks to the current byte to output a string upon matching consecutive bytes in the block to the current byte and subsequent bytes thereof; and
limiting the number of potential string matches processed based on a control input by skipping the fetching of at least one block of history data associated to the potential string match based on the control input.

16. The method of claim 15 further comprising storing a description of the match that extends beyond the compared fetched block of history data.

17. The method of claim 16 wherein fetching the block of history data associated to the plurality of potential string matches is performed prior to fetching a next block of history data using the stored description of the match that extended beyond the compared block of history data.

18. The method of claim 16 wherein the fetched block of history data comprises redundant data from another block of memory.

19. The method of claim 18 the block of memory data is redundant to a subsequent block of memory.

20. The method of claim 15 further comprising fetching a second block of history data when fetching the block of memory data.

21. The method of claim 20 further comprising comparing the second block of history data to the current byte of the data stream when comparing the block of memory data.

22. The method of claim 15 further comprising:
encoding the description of the repeating pattern with a symbol correlated to the frequency of repetition of the description.

23. The method of claim 15 wherein accessing the table to output the plurality of potential string matches is based upon a plurality of bytes, including the current byte and at least one consecutive byte thereof.

24. The method of claim 23 further comprising outputting a literal when the matched bytes are less than a predetermined length.

25. The method of claim 15 further comprising:
accessing the table to output a second plurality of potential string matches upon entry of at least one consecutive byte of the current byte;
processing the second potential string matches; and
determining longer matching consecutive bytes from the plurality of potential string matches and the second plurality of potential string matches to output as the string.

26. The method of claim 15 wherein the string comprises a length and a distance parameter.

27. A method comprising:
- receiving a data stream having a current byte and a stream of preceding and subsequent bytes thereof;
- storing the stream of preceding bytes in blocks of history data;
- processing a table to output a plurality of potential string matches upon entry of the current byte, the table having keys associated to addresses of stored history data;
- processing the potential string matches by fetching the blocks of history data associated with each of the plurality of potential string matches and comparing a portion of each of the blocks to the current byte to output a string upon matching consecutive bytes in the block to the current byte and subsequent bytes thereof; and
- limiting the number of potential string matches processed based on a control input by skipping the comparing of at least one fetched block of history data associated to the potential string match based on the control input.

28. An apparatus comprising:
- means for receiving a data stream having a current byte and a stream of preceding and subsequent bytes thereof;
- means for storing the stream of preceding bytes in blocks of history data;
- means for accessing a table to output a plurality of potential string matches upon entry of the current byte, the table having keys associated to addresses of stored history data;
- means for processing the potential string matches by fetching the blocks of history data associated with each of the plurality of potential string matches and comparing a portion of each of the blocks to the current byte to output a string upon matching consecutive bytes in the block to the current byte and subsequent bytes thereof; and
- means for limiting the number of potential string matches processed based on a control input by skipping the fetching of at least one block of history data associated to the potential string match based on the control input.

29. A non-transitory computer program product comprising:
- a computer readable storage medium having a computer readable program, wherein the computer readable program when executed on a computer causes:
- receiving a data stream having a current byte and a stream of preceding and subsequent bytes thereof;
- storing the stream of preceding bytes in blocks of history data;
- accessing a table to output a plurality of potential string matches upon entry of the current byte, the table having keys associated to addresses of stored history data;
- processing the potential string matches by fetching the blocks of history data associated with each of the plurality of potential string matches and comparing a portion of each of the blocks to the current byte to output a string upon matching consecutive bytes in the block to the current byte and subsequent bytes thereof; and
- limiting the number of potential string matches processed based on a control input skipping the fetching of at least one block of history data associated to the potential string match based on the control input.

30. A method comprising:
- receiving a data stream having a current byte and a stream of preceding and subsequent bytes thereof;
- storing the stream of preceding bytes in blocks of history data;
- processing a table to output a plurality of potential string matches upon entry of a portion of the data stream, the table having keys associated to addresses of stored history data; and
- processing the potential string matches by fetching the blocks of history data associated with each of the plurality of potential string matches and comparing a portion of each of the blocks to the current byte to output a string upon matching consecutive bytes in the block to the current byte and subsequent bytes thereof; and
- processing a second plurality of potential string matches as a result of speculating that the comparison does not result in output of the string.

31. The method of claim 30 wherein processing the second plurality of potential string matches as a result of speculating further comprises fetching a second blocks of history data before the output of the string.

32. A system comprising:
- an input port receiving a data stream having a current byte and a stream of preceding and subsequent bytes thereof;
- a history memory storing the stream of preceding bytes in blocks of history data;
- an index engine having a table of keys associated to memory addresses of the blocks, the index engine accessing the table to output a plurality of potential string matches upon entry of a portion of the data stream; and
- a search engine processing the potential string matches by fetching the blocks of history data associated with each of the plurality of potential string matches and comparing a portion of each of the blocks to the current byte to output a string upon matching consecutive bytes in the block to the current byte and subsequent bytes thereof, the search engine processing a second plurality of potential string matches as a result of speculating that the comparison does not result in output of the string.

33. An apparatus comprising:
- means for receiving a data stream having a current byte and a stream of preceding and subsequent bytes thereof;
- means for storing the stream of preceding bytes in blocks of history data;
- means for accessing a table to output a plurality of potential string matches upon entry of the current byte, the table having keys associated to addresses of stored history data;
- means for processing the potential string matches by fetching the blocks of history data associated with each of the plurality of potential string matches and comparing a portion of each of the blocks to the current byte to output a string upon matching consecutive bytes in the block to the current byte and subsequent bytes thereof; and
- means for limiting the number of potential string matches processed based on a control input by skipping the comparing of at least one fetched block of history data associated to the potential string match based on the control input.

34. A non-transitory computer program product comprising:
- a computer readable storage medium having a computer readable program, wherein the computer readable program when executed on a computer causes:
- receiving a data stream having a current byte and a stream of preceding and subsequent bytes thereof;
- storing the stream of preceding bytes in blocks of history data;

accessing a table to output a plurality of potential string matches upon entry of the current byte, the table having keys associated to addresses of stored history data;

processing the potential string matches by fetching the blocks of history data associated with each of the plurality of potential string matches and comparing a portion of each of the blocks to the current byte to output a string upon matching consecutive bytes in the block to the current byte and subsequent bytes thereof; and limiting the number of potential string matches processed based on a control input by skipping the comparing of at least one fetched block of history data associated to the potential string match based on the control input.

* * * * *

UNITED STATES PATENT AND TRADEMARK OFFICE
CERTIFICATE OF CORRECTION

| | |
|---|---|
| PATENT NO. | : 8,350,732 B2 |
| APPLICATION NO. | : 13/105401 |
| DATED | : January 8, 2013 |
| INVENTOR(S) | : David A. Carlson |

It is certified that error appears in the above-identified patent and that said Letters Patent is hereby corrected as shown below:

Column 21, Claim 29, Line 60
delete "input skipping" and insert --input by skipping--

Signed and Sealed this
Nineteenth Day of March, 2013

Teresa Stanek Rea
*Acting Director of the United States Patent and Trademark Office*